(12) United States Patent
Van De Vijver et al.

(10) Patent No.: US 8,749,756 B2
(45) Date of Patent: *Jun. 10, 2014

(54) LITHOGRAPHIC APPARATUS AND DEVICE MANUFACTURING METHOD

(75) Inventors: Yuri Johannes Gabrial Van De Vijver, Best (NL); Jan Bernard Plechelmus Van Schoot, Eindhoven (NL); Gerardus Hubertus Petrus Maria Swinkels, Eindhoven (NL); Hendrikus Gijsbertus Schimmel, Utrecht (NL); Dzmitry Labetski, Eindhoven (NL); Tjarko Adriaan Rudolf Van Empel, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 13/361,545

(22) Filed: Jan. 30, 2012

(65) Prior Publication Data

US 2012/0147348 A1 Jun. 14, 2012

Related U.S. Application Data

(63) Continuation of application No. 11/898,933, filed on Sep. 17, 2007, now Pat. No. 8,115,900.

(51) Int. Cl.
*G03B 27/52* (2006.01)
*H05G 2/00* (2006.01)
*G03F 7/20* (2006.01)

(52) U.S. Cl.
CPC ........ *G03F 7/70033* (2013.01); *G03F 7/70916* (2013.01); *H05G 2/003* (2013.01); *H05G 2/008* (2013.01)
USPC ........................................ 355/30; 250/504 R

(58) Field of Classification Search
CPC ............ G03F 7/70033; G03F 7/70916; G03F 7/70841; G03F 7/70808; G03F 7/70908; H05G 2/00; H05G 2/001; H05G 2/003; H05G 2/008
USPC .................. 355/30, 53, 67; 250/492.2, 493.1, 250/503.1, 504 R
See application file for complete search history.

(56) References Cited

U.S. PATENT DOCUMENTS

| | | | |
|---|---|---|---|
| 6,219,368 B1 | 4/2001 | Govorkov | |
| 6,770,895 B2 | 8/2004 | Roux | 250/492.2 |
| 6,897,456 B2 | 5/2005 | Hasegawa et al. | |
| 8,115,900 B2* | 2/2012 | Van De Vijver et al. | 355/30 |
| 2003/0006380 A1 | 1/2003 | Van Empel et al. | |

(Continued)

FOREIGN PATENT DOCUMENTS

| JP | 2004-289151 | 10/2004 |
|---|---|---|
| JP | 2006-080108 | 3/2006 |

(Continued)

*Primary Examiner* — Steven H Whitesell Gordon
(74) *Attorney, Agent, or Firm* — Pillsbury Winthrop Shaw Pittman LLP

(57) ABSTRACT

A lithographic apparatus is arranged to project a pattern from a patterning device onto a substrate is disclosed. The lithographic apparatus includes an illumination system and an outlet connected to a pumping system to pump away gas from between an inner wall and outer wall of the illumination system or, if a radiation source is present, between the inner wall of the illumination system and an inner wall of the radiation source.

20 Claims, 10 Drawing Sheets

(56) References Cited

U.S. PATENT DOCUMENTS

| | | | |
|---|---|---|---|
| 2004/0079902 A1* | 4/2004 | Bristol | 250/504 R |
| 2004/0183030 A1 | 9/2004 | Roux | |
| 2005/0236584 A1* | 10/2005 | Tsuji | 250/492.1 |
| 2006/0097203 A1* | 5/2006 | Bykanov et al. | 250/504 R |
| 2006/0119828 A1* | 6/2006 | Ito et al. | 355/69 |
| 2006/0186356 A1 | 8/2006 | Imai et al. | |
| 2006/0243923 A1* | 11/2006 | Seki | 250/493.1 |
| 2007/0102653 A1 | 5/2007 | Bowering et al. | |
| 2007/0188721 A1* | 8/2007 | Hasegawa | 355/30 |
| 2009/0057567 A1 | 3/2009 | Bykanov et al. | |
| 2009/0154642 A1* | 6/2009 | Bykanov et al. | 378/34 |

FOREIGN PATENT DOCUMENTS

| | | |
|---|---|---|
| JP | 2007-179881 | 7/2007 |
| JP | 2010-538456 | 12/2010 |
| WO | 2009/032055 | 3/2009 |

\* cited by examiner

LITHOGRAPHIC APPARATUS AND DEVICE MANUFACTURING METHOD

This application is a continuation of U.S. patent application Ser. No. 11/898,933, filed Sep. 17, 2007 now U.S. Pat. No. 8,115,900, now allowed, which is incorporated herein in its entirety by reference.

FIELD

The present invention relates to a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). A patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 * \frac{\lambda}{NA_{PS}} \qquad (1)$$

where $\lambda$ is the wavelength of the radiation used, $NA_{PS}$ is the numerical aperture of the projection system used to print the pattern, $k_1$ is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture $NA_{PS}$ or by decreasing the value of $k_1$.

In order to shorten the exposure wavelength and, thus, reduce the minimum printable size, it has been proposed to use an extreme ultraviolet (EUV) radiation source. An EUV radiation source is configured to output a radiation wavelength of about 13 nm. Thus, an EUV radiation source may constitute a significant step toward achieving small features printing. Such radiation is termed extreme ultraviolet or soft x-ray, and possible sources include, for example, a laser-produced plasma source (LPP source), a discharge plasma source (DPP source), or synchrotron radiation from an electron storage ring.

SUMMARY

Some types of EUV radiation sources, for instance a LPP source, produce contamination along with the EUV radiation. Some LPP sources have been known to produce HBr, in molecular and/or acidic form. Since the pressure in an EUV radiation source is generally high relative to the pressure in the lithographic apparatus or another part of the lithographic apparatus if the radiation source is part of the lithographic apparatus, the contamination will tend to enter and contaminate an illumination system used with or part of the lithographic apparatus.

It is desirable, for example, to eliminate or reduce source-produced contamination of the illumination system or other structures.

According to an aspect, there is provided a lithographic apparatus arranged to project a pattern from a patterning device onto a substrate, the lithographic apparatus comprising:

an illumination system configured to condition radiation from a radiation source, the illumination system having an inner wall facing away from the radiation source and an outer wall facing toward the radiation source, the inner and outer walls having an aperture to allow radiation from the radiation source to pass into the illumination system;

a pumping system configured to pump away gas;

an outlet connected to the pumping system, the outlet located at or near the aperture and located between the inner wall and the outer wall of the illumination system or, if the lithographic apparatus comprises a radiation source, between the inner wall of the illumination system and an inner wall of the radiation source facing toward the radiation source and adjacent the inner wall of the illumination system; and a support structure constructed to hold the patterning device, the patterning device being capable of imparting the radiation with a pattern in its cross-section to form a patterned radiation beam.

According to an aspect, there is provided a radiation source arranged to emit radiation, the source comprising:

a droplet generator configured to generate droplets of a fuel liquid;

a laser configured to produce a laser beam, the laser arranged to direct the laser beam to hit the droplets generated by the droplet generator at an ignition location;

a source chamber in which the ignition location is located, the source chamber having an inner wall with an aperture to pass the radiation out of the radiation source;

a pumping system configured to pump away gas; and an outlet connected to the pumping system, the outlet located at or near the aperture and located outside the inner wall.

According to an aspect, there is provided a lithographic apparatus arranged to project a pattern from a patterning device onto a substrate, the lithographic apparatus comprising:

an illumination system configured to condition radiation from a radiation source, the illumination system having a wall with an aperture to allow radiation from the radiation source to pass into the illumination system;

a suppression flow system configured to provide a gas flow to help prevent contamination particles from passing through the aperture in the direction of the radiation, the suppression flow system comprising a flow distributing structure configured to enhance flow homogeneity in a direction transverse to the flow; and a support structure constructed to hold the patterning device, the patterning device being capable of imparting the radiation with a pattern in its cross-section to form a patterned radiation beam. The flow may comprise one or more gases from the group consisting of: $H_2$, He, Ne, Kr and Ar.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
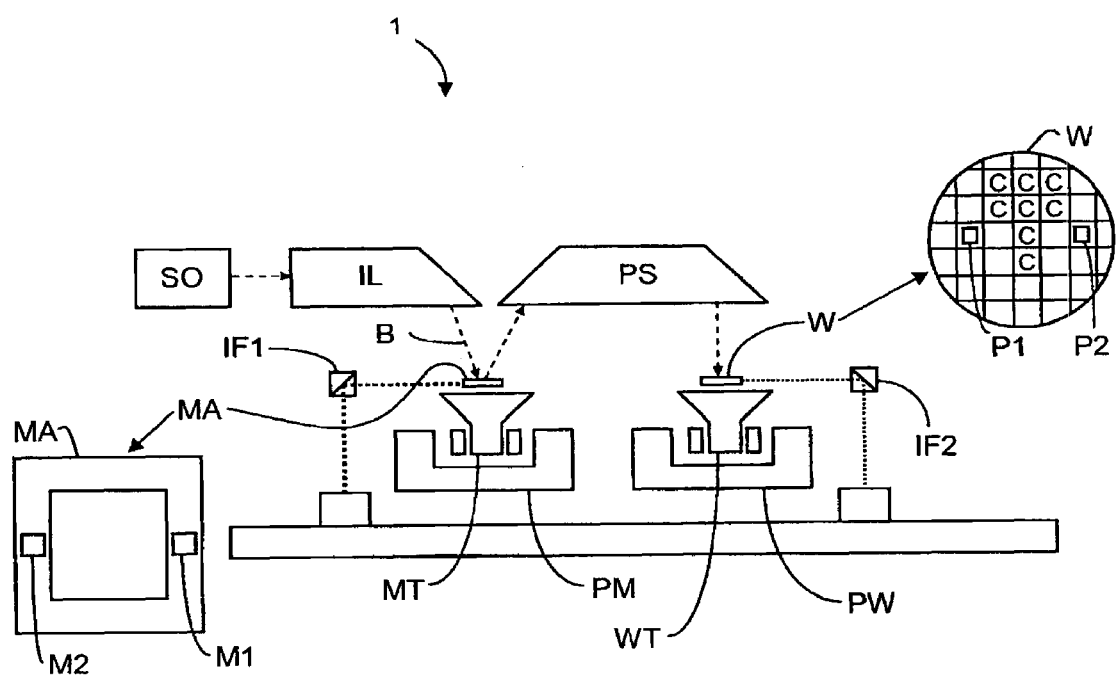
FIG. 1 schematically depicts a lithographic apparatus according to an embodiment of the invention.

FIG. 1 schematically depicts a lithographic apparatus according to one embodiment of the invention. The apparatus comprises:
- an illumination system (illuminator) IL configured to condition a radiation beam B (e.g. EUV radiation);
- a support structure (e.g. a mask table) MT constructed to support a patterning device (e.g. a mask or a reticle) MA and connected to a first positioner PM configured to accurately position the patterning device;
- a substrate table (e.g. a wafer table) WT constructed to hold a substrate (e.g. a resist-coated wafer) W and connected to a second positioner PW configured to accurately position the substrate; and
- a projection system (e.g. a reflective projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" may encompass any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. It may be desired to use a vacuum for EUV or electron beam radiation since a gas may absorb too much radiation or electrons. A vacuum environment may therefore be provided to the whole beam path with the aid of a vacuum wall and one or more vacuum pumps.

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more patterning device support structures). In such "multiple stage" machines, the additional tables and/or support structures may be used in parallel, or preparatory steps may be carried out on one or more tables and/or support structures while one or more other tables and/or support structures are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp.

The illuminator IL may comprise an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device.

After being reflected from the patterning device (e.g. mask) MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the patterning device (e.g. mask) MA with respect to the path of the radiation beam B. Patterning device (e.g. mask) MA and substrate W may be aligned using patterning device alignment marks M1, M2 and substrate alignment marks P1, P2.

The depicted apparatus could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above. Combinations and/or variations on the above described modes of use or entirely different modes of use may also be employed.

Figure 2:
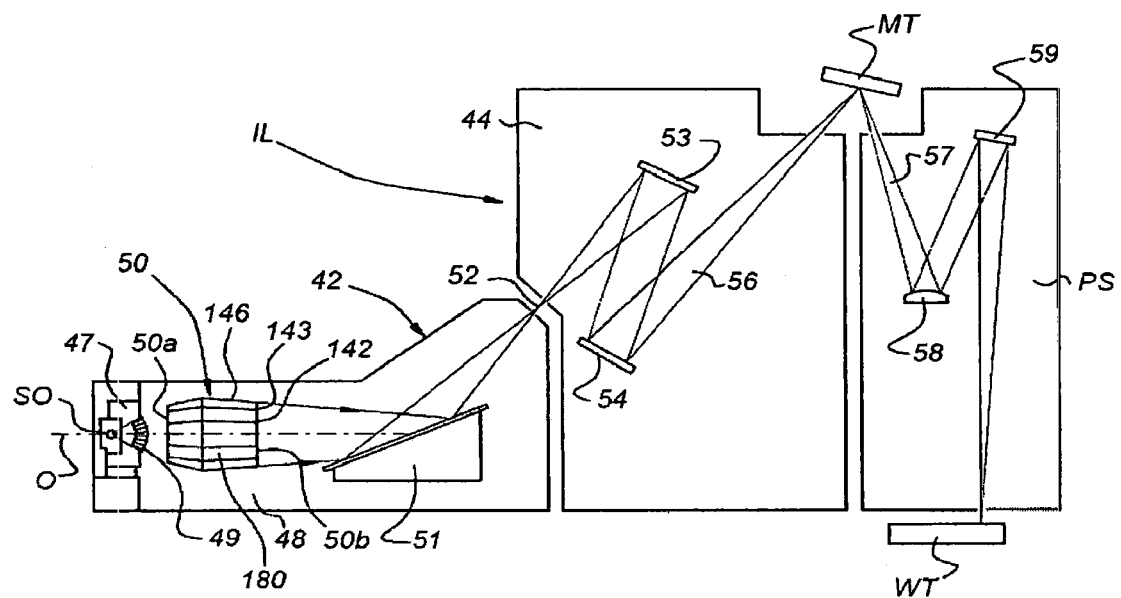
FIG. 2 schematically depicts a side view of an EUV illumination system and projection optics of a lithographic projection apparatus according to an embodiment of FIG. 1.

FIG. 2 shows the projection apparatus 1 in more detail, including a radiation system 42, an illumination system 44, and the projection system PS. The radiation system 42 includes the radiation source SO, which may be a discharge plasma. EUV radiation may be produced by a gas or vapor, for example Xe gas, Li vapor or Sn vapor in which a very hot plasma is created to emit radiation in the EUV range of the electromagnetic spectrum. The very hot plasma is created by causing an at least partially ionized plasma by, for example, an electrical discharge. A partial pressure of, for example, 10 Pa of Xe, Li, Sn vapor or any other suitable gas or vapor may be required for efficient generation of the radiation. In an embodiment, a Xe, Li, or Sn source as EUV source is applied. The at least partially ionized plasma may be produced by hitting, for example, Sn with a suitable: laser beam. In such an embodiment, a partial pressure of, for example, 0.75 Pa of Xe, Li, or Sn vapor at a temperature of 1200° C. or any other suitable gas or vapor may be required for efficient generation of the radiation. The radiation emitted by radiation source SO is passed from a source chamber 47 into a collector chamber 48 via an optional contaminant barrier 49 which is positioned in or behind an opening in source chamber 47. The contaminant barrier 49 may comprise a channel structure. Contaminant barrier 49 may additionally or alternatively comprise a gas barrier. Contaminant barrier 49 may be a combination of a gas barrier and a channel structure. The contaminant barrier 49 further indicated herein at least comprises a channel structure, as known in the art.

The collector chamber 48 includes a radiation collector 50 (herein also indicated as a collector mirror) which may be a grazing incidence collector. Radiation collector 50 has an upstream radiation collector side 50a and a downstream radiation collector side 50b. Radiation passed by collector 50 can be reflected off a grating spectral filter 51 to be focused in a focal point, referred to as virtual source point 52 at an aperture in the collector chamber 48. From collector chamber 48, a beam of radiation 56 is reflected in illumination system 44 via normal incidence reflective elements 53, 54 onto a reticle or mask positioned on reticle or mask table MT. A patterned beam 57 is formed which is imaged in projection system PS via reflective elements 58, 59 onto substrate table WT. More elements than shown may be present in illumination system 44 and/or projection system PS. Grating spectral filter 51 may optionally be present, depending upon the type of lithographic apparatus. Further, there may be more reflective elements present than those shown in the Figures, for example there may be 1-4 more reflective elements present in the projection system than reflective elements 58, 59.

In an embodiment, the collector 50, as described herein more detail, is a nested collector with reflectors 142, 143, and 146, as schematically depicted in FIG. 2, for example, and is used herein as an example of a collector (or collector mirror). Where applicable, collector 50 as a grazing incidence collector may also be considered as a collector in general and, in an embodiment, as a normal incidence collector.

Figure 3A:
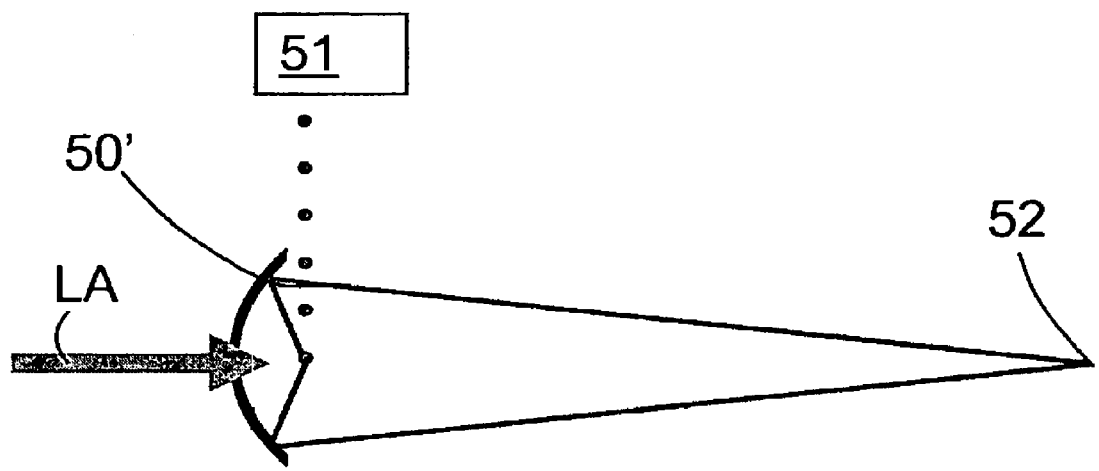
FIGS. 3a and 3b schematically depict a set-up of a laser-produced plasma source.

Instead of a grazing incidence mirror as collector 50, a normal incidence collector 50' may be applied as is shown in FIG. 3a. In FIG. 3a, the plasma is produced by hitting Sn, supplied using a droplet generator 51, with a suitable laser beam LA, for instance a $CO_2$ laser LA. Such an arrangement is commonly known as a laser-produced plasma (LPP) source SO. Desirably, a normal incidence collector 140 is used in combination with a LPP source SO.

Figure 3B:
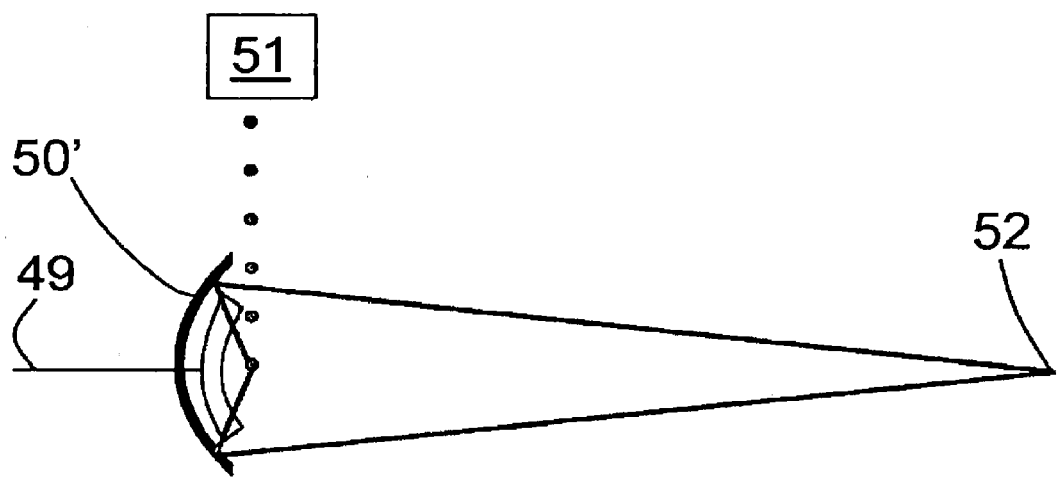

FIG. 3b shows the same general arrangement as does FIG. 3a. However, in FIG. 3b the contaminant barrier 49 is shown which is similar to the contaminant barrier 49 disclosed with reference to FIG. 2.

Additionally or alternative to a grating spectral filter 51, as schematically depicted in FIG. 2, a transmissive optical filter may be applied, or in an embodiment, no filter may be used at all. An optical filter transmissive for EUV and less transmissive for or even substantially absorbing of UV radiation is known in the art. "Grating spectral filter" is herein further indicated as "spectral filter" which includes a grating and/or transmissive filter. Not depicted in schematic FIG. 2, but included as an optional optical element may be an EUV transmissive optical filter, for instance arranged upstream of collector 50, or an optical EUV transmissive filter in illumination system 44 and/or projection system PS.

Figure 4:
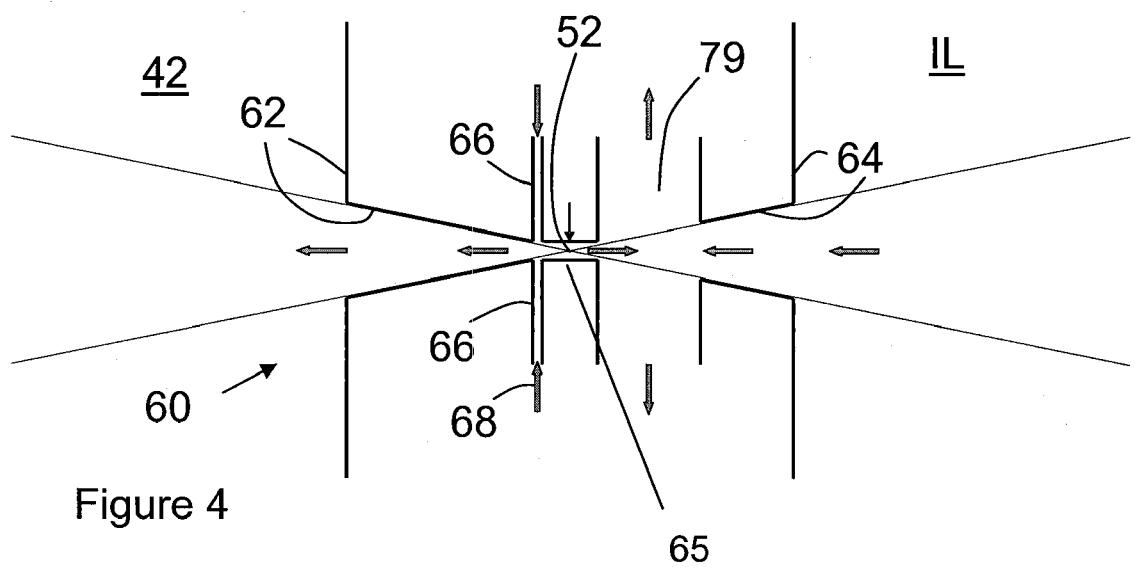
FIG. 4 schematically depicts an interface between a radiation system and an illuminator of the lithographic apparatus of FIG. 1.

FIG. 4 shows an interface 60 between portions of the source SO and illuminator IL of an embodiment of the lithographic apparatus 1. The interface 60 comprises an inner wall 62 of the radiation system 42 and an inner wall 64 of the illuminator IL. As will be appreciated the inner wall 62 of the radiation system 42 may be the outer wall of the illuminator IL or the inner wall 64 of the illuminator IL may be the outer wall of the radiation system 42. A part of the wall 62 in a vicinity of the virtual source point 52, may taper in a direction toward the virtual source point 52 as is the case in the embodiment shown in FIG. 4. The part of the wall 62 may be cone-shaped. Also, a part of the wall 64 of the illuminator IL in the vicinity of the virtual source point 52 may taper in a direction toward the virtual source point 52 (see FIG. 4). The part of this wall 64 may also be cone-shaped. In this embodiment both the part of the wall 62 and the part of the wall 64 are within a radius of 0.15 m of the virtual source point 52. The part of the wall 64 is within a radius of 0.10 m of the virtual source point 52. In FIG. 4 the cone-shaped parts are connected with each other by a tubular part 65.

When the lithographic apparatus 1 is in operation, pressure in the radiation system 42 may typically be about 40 Pa, while pressure in the illuminator IL may be about 3 Pa. Due to the pressure difference between the radiation system 42 and the illuminator IL, contamination particles, particularly HBr, may enter the illuminator IL and contaminate the illumination optics, such as normal incidence reflectors 53, 54.

To suppress the contamination, a suppression flow system may be provided, such as a gas supply 66 at the interface 60. The gas supply 66 is configured to provide a gas flow 68, desirably to a location near the virtual source point 52, to help prevent contamination particles from passing through the interface 60 in the direction of the radiation beam. The gas flow may comprise one or more gases selected from the group consisting of $H_2$, He, Ne, Ar and Kr. Alternatively or additionally, one or more other suitable gases may be used. In an embodiment, the gas flow substantially consists of $H_2$, since $H_2$ absorbs EUV radiation to a lesser extent than He, Ne, Ar and Kr.

Figure 5:
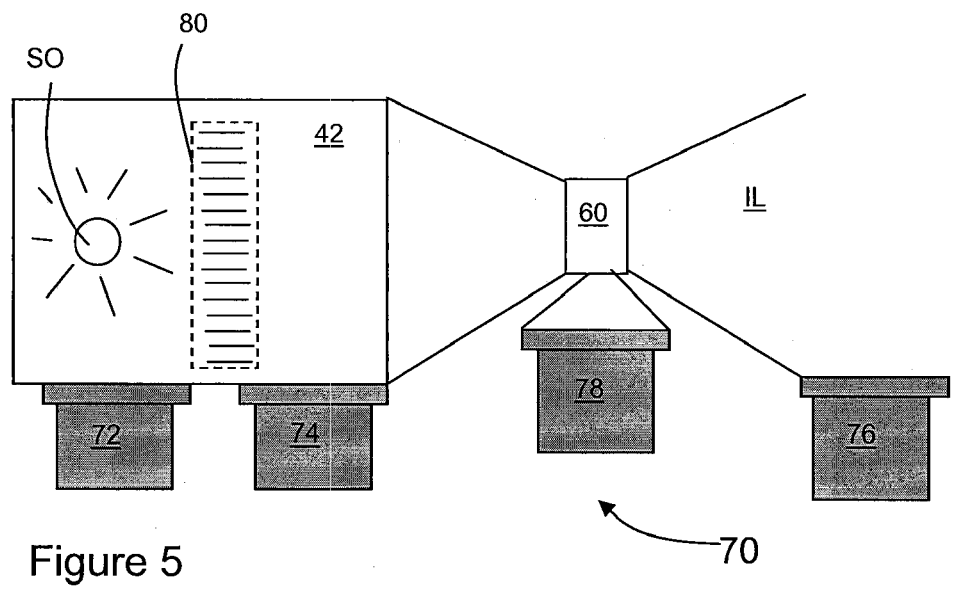
FIG. 5 schematically depicts a radiation system, an illuminator and a pumping system of the lithographic apparatus of FIG. 1.

To help maintain the radiation system 42 and the illuminator IL at a suitable pressure, a pumping system 70 is provided as shown in FIG. 5. In FIG. 5, the pump system is shown to include four pumps. However, less or more pumps may be provided. In this embodiment, two pumps 72, 74 pump away gas at the radiation system 42, one pump 76 pumps away gas at the illuminator and one pump 78 pumps away gas located at or near the interface 60 (e.g., virtual source point 52). In this example, pump 78 pumps away gas through separate tubular structure 79. As seen in FIG. 4, the outlet of the tubular structure 79 is located between the wall 64 and the wall 62. So, for example, the outlet may be located between the inner wall 64 of the illumination system facing away from the radiation source and an outer wall 62 of the illumination system facing toward the radiation source, or between the inner wall 62 of the radiation source and an outer wall 64 of the radiation source facing away from the radiation source, or, where there is both the radiation source and the illumination system, between the inner wall 64 of the illumination system and an inner wall 62 of the radiation source. Thus, the gas is pumped away from the illuminator and the radiation system 42, which includes the source SO. Pump capacity at the interface relaxes the pressure specification of the radiation system. For instance, in a configuration, adding one small turbo pump at the interface 60 could save four large blowers at the source SO.

A contaminant trap (e.g.; a stationary foil trap) 80 may be included in the radiation system 42 between the radiation source SO and the interface 60 or virtual source point 52 to help relieve the gas load from the plasma towards the interface 60 or virtual source point 52. Alternatively or additionally, another structure may be used that is substantially transparent to EUV radiation to similarly help restrict gas passing. Such a structure would, similar to the contaminant trap 82, typically be located between the source SO and the interface 60 or virtual source point 52.

Figure 6:
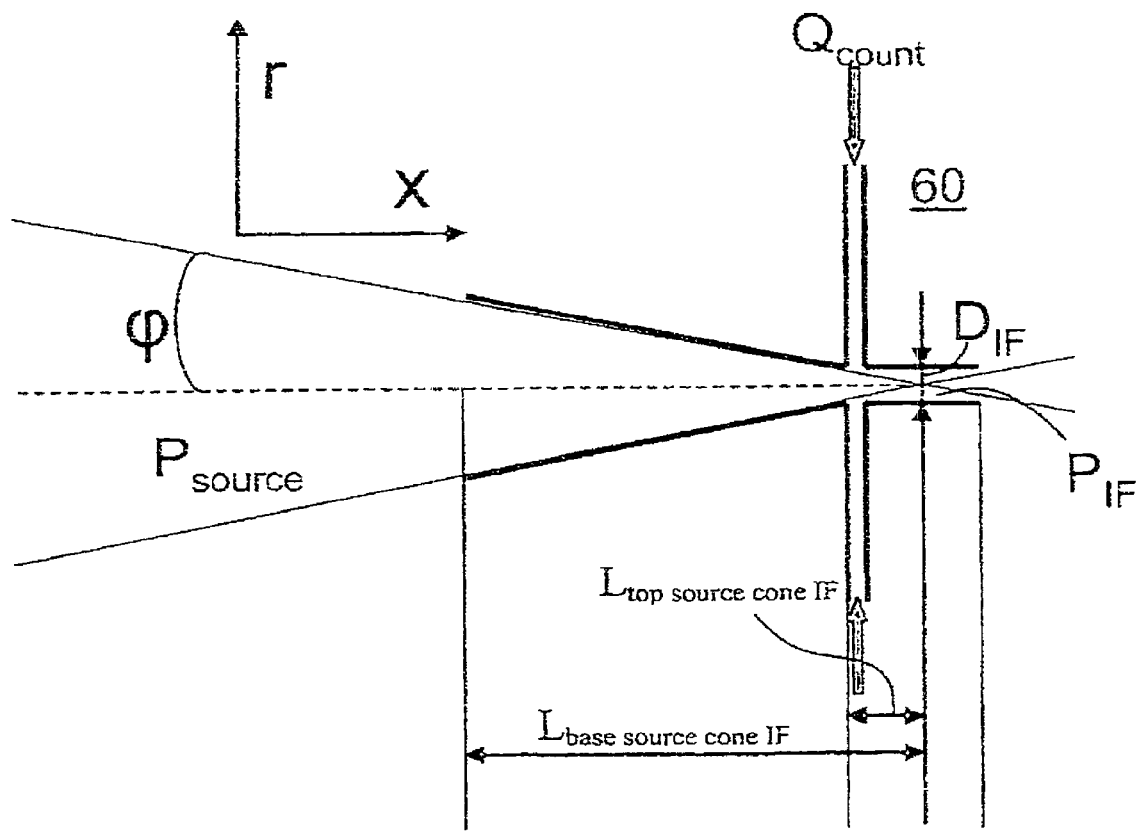
FIG. 6 schematically depicts the interface of FIG. 4.

FIG. 6 is a view similar to FIG. 4. In FIG. 6, however, certain dimensions are indicated, such as angle $\phi$ defining the so-called outer NA, the diameter $D_{IF}$ of the tubular part 65, the distance $L_{top\ source\ cone\ IF}$ between the virtual source point 52 and the top of the cone at the source side of the virtual source point 52 and the distance $L_{base\ source\ cone\ IF}$ between the virtual source point 52 and the base of the cone at the source side of the virtual source point.

Table 1 shows exemplary dimensions and other parameters. In Table 1, $Q_{count}$ is the suppression counterflow, also indicated in FIG. 6. $S_{IF}$ is the pumping speed of the pump 78, $P_{IF}$ is the pressure at or near the virtual source point 52, $P_{IL}$ is the pressure in the illuminator IL, T is the temperature, $L_{top\ illuminator\ cone\ IF}$ is the distance between the virtual source point 52 and the top of the cone at the illuminator side of the virtual source point 52, $L_{base\ illuminator\ cone\ IF}$ is the distance between the virtual source point 52 and the base of the cone at the illuminator side of the virtual source point, $C_{illuminator\ cone}$, $C_{IF}$, $C_{source\ cone}$ are the conductivities of the cone-shaped part of the illuminator-side wall, the tubular part 65, and the cone-shaped part of the radiation system-side wall respectively, $A_{source\ cone}$ is an effective surface cone-shaped part of the radiation system-side wall, and outer NA equals $\eta \cdot \sin \phi \approx \sin \phi$, because the index of refraction $\eta$ is about equal to unity. Desirably, $L_{top\ illuminator\ cone\ IF} + L_{top\ source\ cone\ IF} \approx D$ or $L_{top\ illuminator\ cone\ IF} + L_{top\ source\ cone\ IF} < D$.

TABLE 1

| | |
|---|---|
| $Q_{count}$ [Pa · m³/s] | 2 |
| $S_{IF}$ [m³/s] | 0.5 |
| Outer NA | 0.16 |
| $P_{IF}$ [Pa] | 1.5 |
| $P_{IL}$ [Pa] | 3 |
| T [K] | 300 |
| $D_{IF}$ [m] | 0.004 |
| $C_{illuminator\ cone}$ [m³/s] | 0.064 |
| $C_{IF}$ [m³/s] | 0.01 |
| $C_{source\ cone}$ [m³/s] | 0.127 |
| $L_{base\ source\ cone\ IF}$ [m] | 0.116 |
| $L_{top\ source\ cone\ IF}$ [m] | 0.008 |
| $L_{base\ illuminator\ cone\ IF}$ [m] | 0.09 |
| $L_{top\ illuminator\ cone\ IF}$ [m] | 0.03 |
| P · D [Pa · m²/s] | 7 |
| $A_{source\ cone}$ [m²] | 0.00023 |

Also, the following equations can be derived:

$$P_s = \frac{P_{IF} S_{IF}}{C_{IF}} - \frac{C_{illuminator\_cone}(P_{source\_cone} - P_{IF})}{C_{IF}} + \frac{S_{IF} P_{IF}}{C_{source\_cone}} - \frac{Q_{count}}{C_{source\_cone}} - \frac{C_{illuminator\_cone}(P_{source\_cone} - P_{IF})}{C_{source\_cone}} \quad ((2))$$

and $$Pé \cong \frac{L_{sc}}{A_{sc}(PD)}(Q_{cont} - P_{if} S_{if}) \quad (3)$$

$P_s$ is the source pressure and Pé is the so-called Péclet number which is a measure for the amount of suppression of the mass diffusion of the contamination particles. Using equations 2 and 3, it can be estimated how the source pressure $P_s$ and Péclet number Pé will change when slightly changing one of the input parameters, say by a 5% increase.

Figure 7:
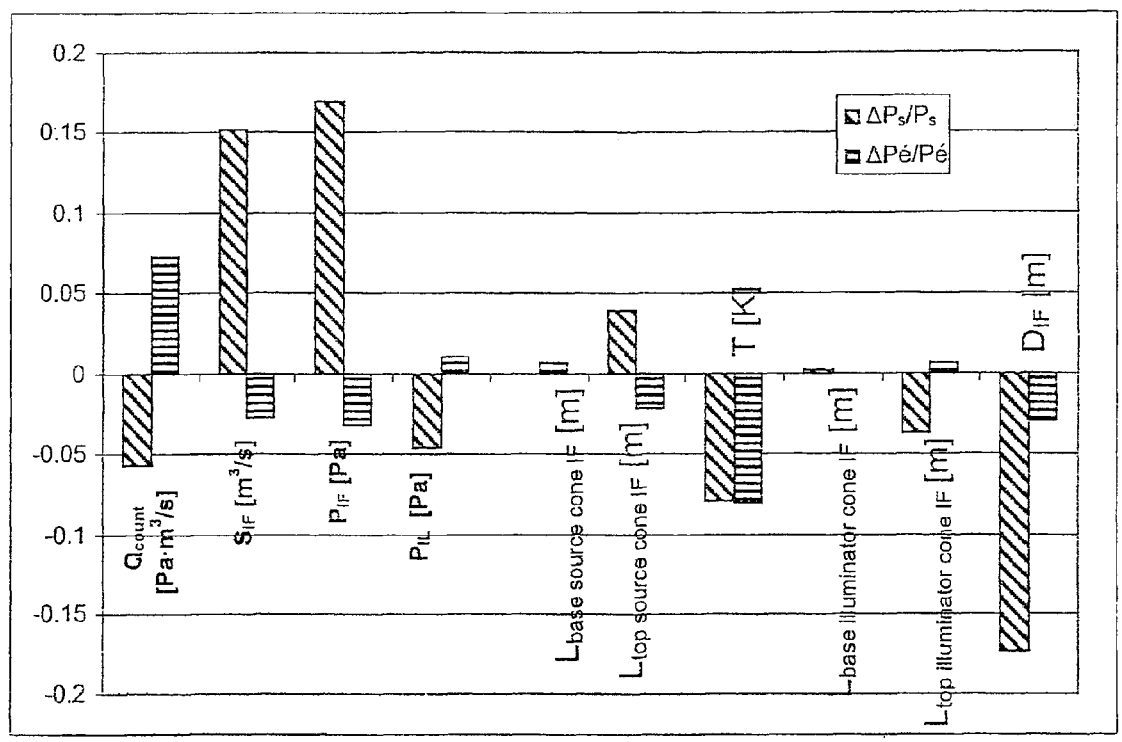
FIG. 7 shows results of an estimation of relative difference of source pressure and the Péclet number when varying predetermined parameters.

The results are shown in FIG. 7. It can be seen that the increase in the pumping speed $S_{IF}$ and the pressure $P_{IF}$ at or near the virtual source point 52 will increase the source pressure $P_s$, and decrease the Péclet number Pé. To compensate for that, the suppression counterflow $Q_{count}$ should be increased. The decrease of the diameter $D_{IF}$ of the tubular part 65 will increase the source pressure $P_s$ and suppression.

In order to help prevent the formation of an instability in the gas flow in the cone-shaped parts of the inner walls 62, 64, the aforementioned suppression flow system may comprise, possibly in addition to the supply 66, a flow distributing structure arranged and configured to enhance flow homogeneity in a direction transverse to the flow. Such a flow distributing structure may comprise one or more porous media, a sieve and/or any other suitable component or structure.

Figure 8:
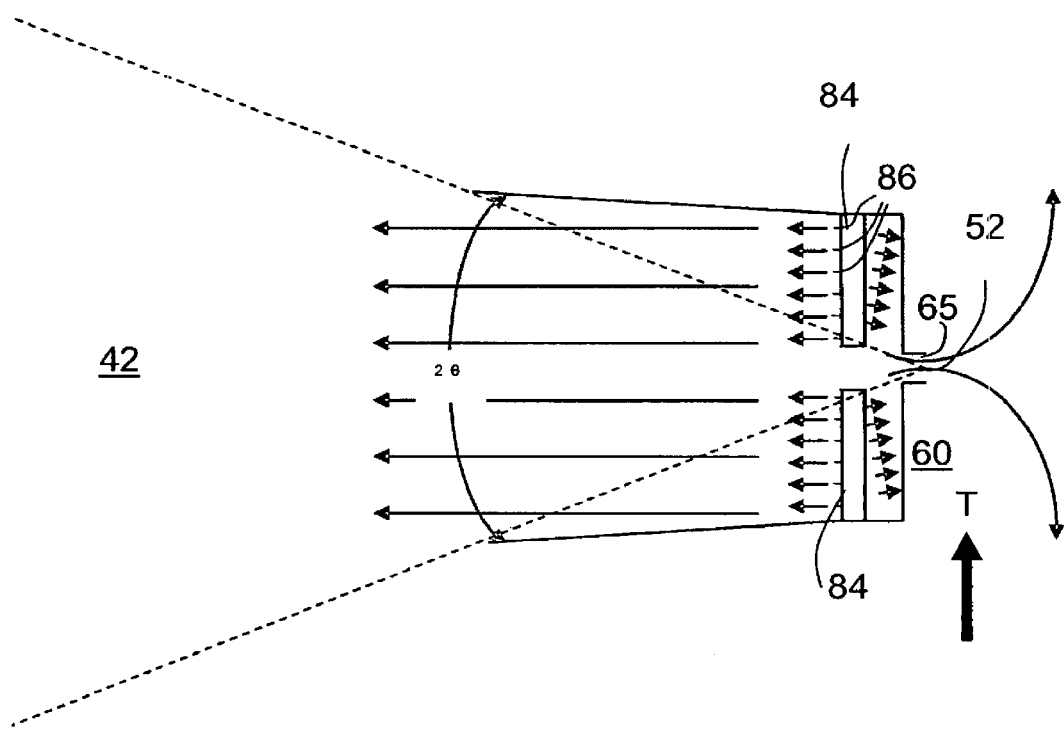
FIGS. 8-11 schematically show further embodiments of the interface of FIG. 4.

FIG. 8 shows a possible flow distributing structure 84. The gas is supplied to the flow distributing structure 84 by the supply 66. In this example, the flow distributing structure comprises a set of nozzles 86 arranged to improve homogeneity and smoothness in the direction T transverse to the flow. Consequently, laminarity of the flow may be improved. To avoid appearance of an instability in gas when exiting the flow distributing structure 84, the gas that is supplied to the structure 84 has a flow velocity which is lower than the velocity of sound in that gas. The cone-shaped part of the wall 62 may be constructed to have a low flow resistance to allow the pressure of the gas when entering this cone-shaped part to be about the same as the pressure of the gas when exiting this cone-shaped part.

Figure 10:
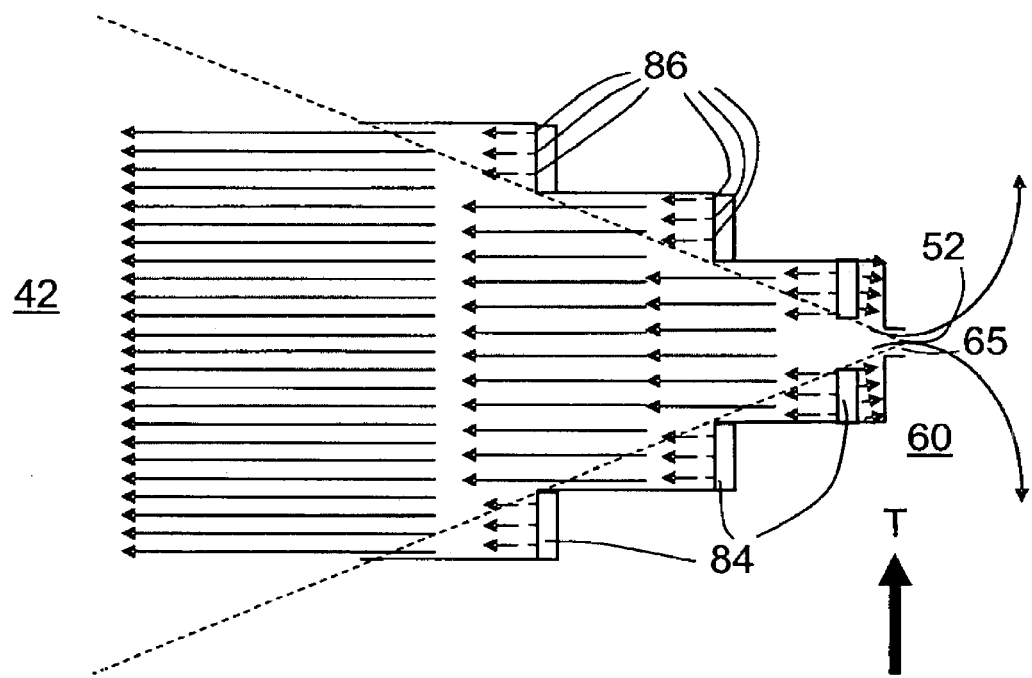

In the example of FIG. 10, a supersonic flow may be used in a diffuser by supplying the gas at sonic or supersonic velocity. This may allow for a high velocity in the cone-shaped part of the wall 62 to cause a large amount of suppression. Also, the large flow velocity may cause a shock wave which is difficult for possible contaminants to pass.

Figure 9:
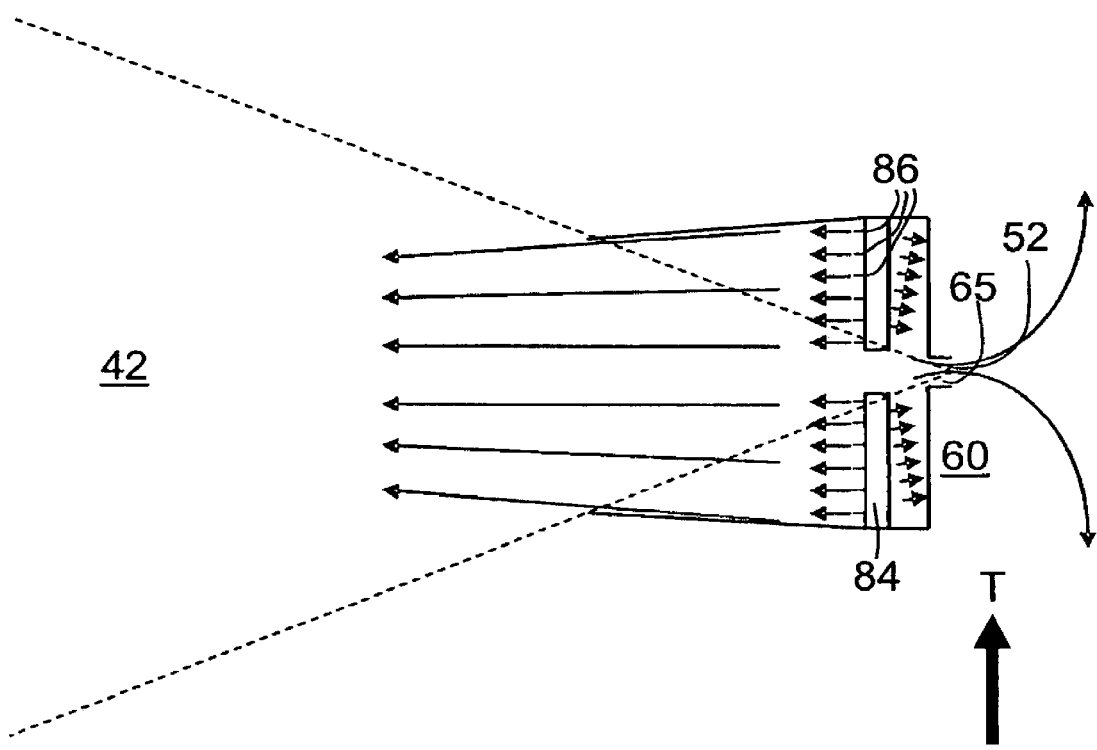

FIG. 9 shows an embodiment of a possible flow distributing structure 84. The cone-shaped part of wall 62 does not taper towards the virtual source point 52, but rather to the source SO. In this example, the flow distributing structure 84 is provided with a set of nozzles 86 to direct flow towards the source. The set of nozzles 86 extends in a direction transverse to the flow direction. As in the example of FIG. 8 in which the structure 84 was a diffuser, here the set of nozzles of the flow distributing structure 84 helps improve homogeneity and smoothness in the direction T transverse to the flow. Thus, laminarity of the flow may be improved. Desirably, the flow velocity in the diffuser is smaller than the velocity of sound in the gas.

In the embodiment of FIG. 10, it can be seen that, when viewing from the virtual source point 52 to the source SO, the cross-section of the wall 62 is increased step-by-step. At each step, a flow of gas is supplied to compensate for the flow speed decrease on one hand and to help minimize the presence of an instability on the other. Such a configuration may provide a constant, laminar and high velocity flow towards the source SO. Furthermore, additional suppression of contaminant diffusion along the wall 62 may be prevented.

Figure 11:
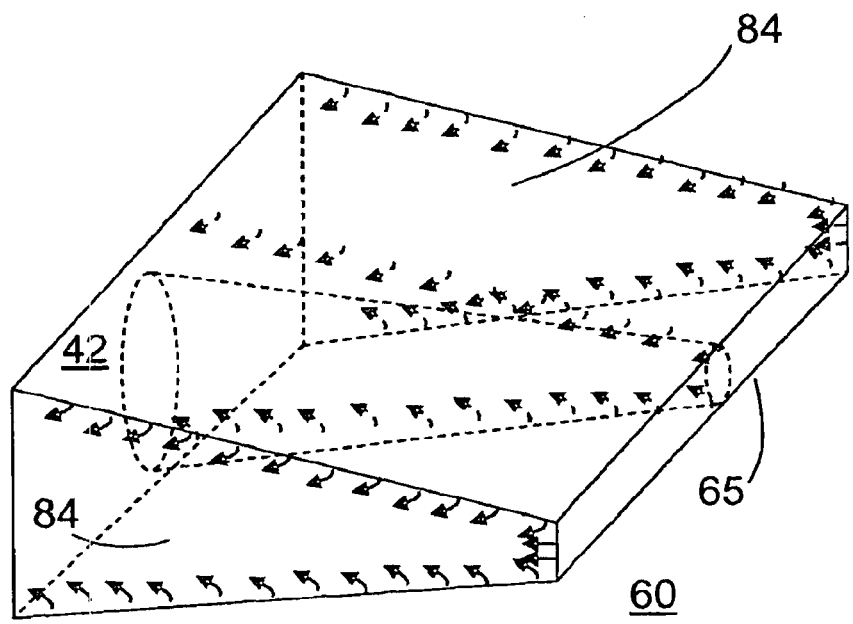

In a further embodiment, a so-called purge hood construction as shown in FIG. 11 is provided. This would allow for flat walls 62. A porous material can be used at the walls 62, the material forming the flow distributing structure 84. Such a configuration allows for combining a small flow velocity with a high mass flow rate through the flow distributing structure 84. The small flow velocity allows for the flow to become laminar quickly after leaving the flow distributing structure 84 and the high mass flow rate allows for a high amount suppression, i.e. high Péclet number Pé.

Generally the presence of the flow distributing structure 84 as discussed above allows for a smaller size of the interface between the radiation system 42 and the illuminator IL. The suppression flow system may comprise the flow distributing structure arranged and configured to enhance flow homogeneity in a direction transverse to the flow without the presence of a pumping system configured to pump away gas at or near an aperture to allow radiation from the radiation source into the illumination system.

Figure 12:
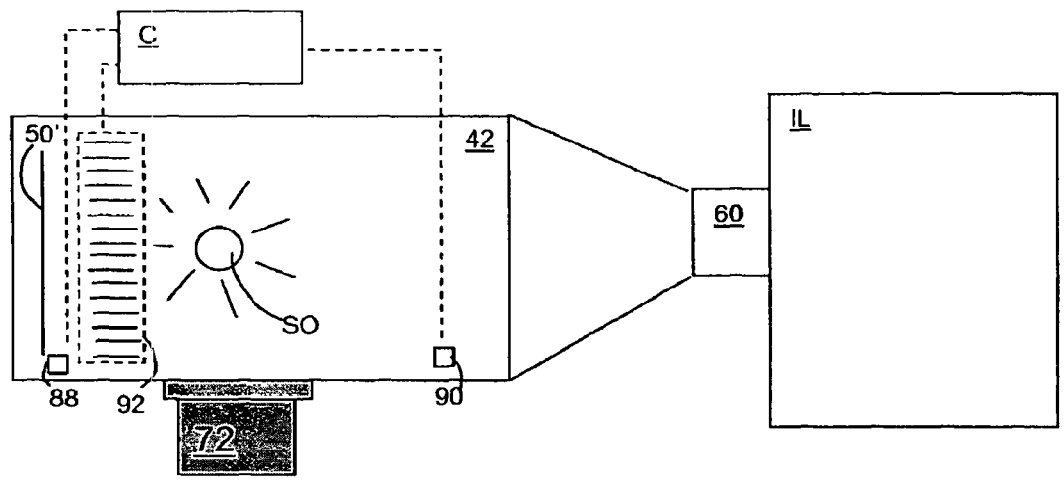
FIG. 12 schematically depicts a modification to the radiation system, the illuminator and the pumping system of FIG. 5.

A modification to the embodiments of the lithographic apparatus is shown in FIG. 12. In FIG. 12, all but one of the aforementioned pumps 72, 74, 76 and 78 is shown. The lithographic apparatus shown in FIG. 12 comprises a thermal control system configured to maintain a temperature difference between at least two locations in the radiation system. Maintaining such a temperature difference may allow for a higher pressure in the radiation system 42. In the example of FIG. 12, the control system comprises a controller C, a first temperature sensor 88, a second temperature sensor 90 and a heat exchanger 92. In this example, the controller C is configured to activate the heat exchanger 92 based on the temperature measured by the first temperature sensor 88 and the second temperature sensor 90. Desirably, the temperature measured by the first temperature sensor 88 is maintained low relative to the temperature measured by the second temperature sensor 90. This will allow for a relatively low temperature between the source SO and the collector 50' mirror to stop fast ions, while the temperature in the remaining part of the radiation system 42 is allowed to remain high to allow for good transmission.

The principle can be understood using the following equation:

$$Tr = \exp\left(-\frac{p \cdot \sigma \cdot L}{k \cdot T}\right) \quad (4)$$

Tr is transmissivity of the gas to extreme ultraviolet radiation, P is the partial pressure of a certain absorbing gas, $\sigma$ is the absorbing cross-section of the gas, L is the length of the radiation path for which the transmissivity is to be determined, k is the Boltzman constant, and T is the temperature. From equation 4, it can be seen that the transmissivity depends on the ratio P/T rather than P by itself. Therefore, by maintaining a certain temperature difference between certain locations in the radiation system 42, the total transmissivity along an optical path of the radiation emitted by the source SO can be maintained at a suitable level while allowing for relatively high pressures at locations where such high pressures may be desirable.

Thus, when the temperature is maintained at a low level between the source SO and the collector 50', the high pressure will help stop the fast ions, while the loss in transmissivity is compensated in the vicinity of the second temperature sensor 90 where the high pressure is compensated using a high temperature.

Such a control system may be used in the absence of a pumping system configured to pump away gas at or near an aperture to allow radiation from the radiation source into the illumination system. In addition to or instead of the heat exchanger 92, a heating structure may be provided, for instance at a position near the second temperature sensor 90.

In an embodiment, there is provided a lithographic apparatus arranged to project a pattern from a patterning device onto a substrate, the lithographic apparatus comprising: an illumination system configured to condition radiation from a radiation source, the illumination system having an inner wall facing away from the radiation source and an outer wall facing toward the radiation source, the inner and outer walls having an aperture to allow radiation from the radiation source to pass into the illumination system; a pumping system configured to pump away gas; an outlet connected to the pumping system, the outlet located at or near the aperture and located between the inner wall and the outer wall of the illumination system or, if the lithographic apparatus comprises a radiation source, between the inner wall of the illumination system and an inner wall of the radiation source facing toward the radiation source and adjacent the inner wall of the illumination system; and a support structure constructed to hold the patterning device, the patterning device being capable of imparting the radiation with a pattern in its cross-section to form a patterned radiation beam.

In an embodiment, the outlet is located at or near a focal point of the radiation. In an embodiment, the lithographic apparatus further comprises the radiation source and a collector configured to focus radiation emitted by the radiation source into a focal point. In an embodiment, a part of the outer wall of the illumination system or, if the lithographic apparatus comprises a radiation source, the inner wall of the radiation source is tapered in a direction toward the focal point. In an embodiment, the part is cone shaped. In an embodiment, the tapered part is within a radius of 0.15 m of the focal point. In an embodiment, the outlet of the pumping system extends through the part. In an embodiment, the lithographic apparatus further comprises a suppression flow system configured to provide a gas flow to help prevent contamination particles from passing through the aperture in the direction of the radiation. In an embodiment, the gas flow comprises one or more gases selected from the group consisting of: $H_2$, He, Ne, Kr and Ar. In an embodiment, the suppression flow system comprises a flow distributing structure arranged and configured to enhance flow homogeneity in a direction transverse to the flow. In an embodiment, the lithographic apparatus further comprises: a substrate table constructed to hold the substrate; and a projection system configured to project the patterned radiation beam onto a target portion of the substrate. In an embodiment, a part of the inner wall of the illumination system is tapered in a direction toward a focal point of the radiation. In an embodiment, the part of the inner wall of the illumination system is cone shaped. In an embodiment, the tapered part of the inner wall is within a radius of 0.15 m of the focal point. In an embodiment, the tapered part of the inner wall is within a radius of 0.10 m of the focal point. In an embodiment, the outlet of the pumping system extends through the part of the inner wall of the illumination system.

In an embodiment, there is provided a lithographic apparatus arranged to project a pattern from a patterning device onto a substrate, the lithographic apparatus comprising: an illumination system configured to condition radiation from a radiation source, the illumination system having a wall with an aperture to allow radiation from the radiation source to pass into the illumination system; a suppression flow system configured to provide a gas flow to help prevent contamination particles from passing through the aperture in the direction of the radiation, the suppression flow system comprising a flow distributing structure configured to enhance flow homogeneity in a direction transverse to the flow; and a support structure constructed to hold the patterning device, the patterning device being capable of imparting the radiation with a pattern in its cross-section to form a patterned radiation beam.

In an embodiment, the gas flow comprises one or more gases from the group consisting of: $H_2$, He, Ne, Kr and Ar.

In an embodiment, there is provided a radiation source arranged to emit radiation, the source comprising: a droplet generator configured to generate droplets of a fuel liquid; a laser configured to produce a laser beam, the laser arranged to direct the laser beam to hit the droplets generated by the droplet generator at an ignition location; a source chamber in which the ignition location is located, the source chamber having an inner wall with an aperture to pass the radiation out of the radiation source; a pumping system configured to pump away gas; and an outlet connected to the pumping system, the outlet located at or near the aperture and located outside the inner wall.

In an embodiment, the outlet is located at or near a focal point of the radiation. In an embodiment, a part of the inner wall is tapered in a direction toward a focal point of the radiation. In an embodiment, the part of the inner wall is cone shaped. In an embodiment, the source chamber comprises an outer wall opposite the inner wall and wherein a part of the outer wall is tapered in a direction toward a focal point of the radiation. In an embodiment, the radiation source further comprises a suppression flow system configured to provide a gas flow to help prevent contamination particles from passing through the aperture in the direction of the radiation, wherein the gas flow comprises one or more gases selected from the group consisting of: $H_2$, He, Ne, Kr and Ar. In an embodiment, the suppression flow system comprises a flow distributing structure arranged and configured to enhance flow homogeneity in a direction transverse to the flow.

Although specific reference may have been made above to the use of embodiments of the invention in the context of optical lithography, it will be appreciated that the invention may be used in other applications, for example imprint lithography, and where the context allows, is not limited to optical lithography.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A radiation source system, comprising:
   a droplet generator configured to generate droplets of a fuel liquid;
   a laser configured to produce a laser beam, the laser arranged to direct the laser beam to hit the droplets generated by the droplet generator at an ignition location to produce radiation;
   a source chamber in which the ignition location is located, the source chamber having an inner wall with an aperture to pass the radiation out of the source chamber;
   a pumping system configured to pump away gas;
   an outlet connected to the pumping system and the source chamber, the outlet located at or near the aperture and located outside the inner wall; and
   a suppression flow system configured to provide a gas flow in a direction toward the ignition location to help prevent contamination particles from passing through the aperture in the direction of the radiation, the suppression flow system comprising an inlet opening to supply gas for the gas flow, the inlet opening being between the inner wall and the outlet.

2. The radiation system of claim 1, wherein the outlet is located at or near a focal point of the radiation.

3. The radiation system of claim 1, wherein the inlet opening substantially surrounds the radiation.

4. The radiation system of claim 1, wherein the outlet opening substantially surrounds the radiation.

5. The radiation system of claim 1, wherein the source chamber comprises an outer wall opposite the inner wall and wherein a part of the outer wall is tapered in a direction toward a focal point of the radiation.

6. The radiation source system of claim 1, wherein the inlet opening comprises a flow distributing structure, extending along a surface inside the aperture, having a two-dimensional array of inlets in or on the surface to supply gas to the aperture.

7. The radiation source system of claim 6, wherein the flow distributing structure comprises a flat wall of porous media.

8. The radiation source system of claim 1, wherein a part of the wall is tapered in a direction toward a focal point of the radiation and the tapered part is within a radius of 0.15 m of the focal point.

9. A method, comprising:
producing radiation in a source chamber having an inner wall with an aperture to pass the radiation out of the source chamber, the producing radiation comprising generating droplets of a fuel liquid and directing a laser beam to hit the generated droplets at an ignition location in the source chamber;
pumping away gas through an outlet that is connected to the chamber, the outlet located at or near the aperture and located outside the inner wall; and
providing a gas flow in a direction toward the ignition location to help prevent contamination particles from passing through the aperture in the direction of the radiation by using an inlet opening to supply gas for the gas flow, the inlet opening being between the inner wall and the outlet.

10. The method of claim 9, wherein the outlet is located at or near a focal point of the radiation.

11. The method of claim 9, wherein the inlet substantially surrounds the radiation.

12. The method of claim 9, wherein using the inlet opening comprises using a flow distributing structure, extending along a surface inside the aperture, having a two-dimensional array of inlets in or on the surface to supply gas to the aperture.

13. The method of claim 12, wherein the flow distributing structure comprises a flat wall of porous media.

14. A radiation source system, comprising:
a droplet generator configured to generate droplets of a fuel liquid;
a laser configured to produce a laser beam, the laser arranged to direct the laser beam to hit the droplets generated by the droplet generator at an ignition location;
a source chamber in which the ignition location is located, the source chamber having an inner wall with an aperture to pass the radiation out of the source chamber; and
a suppression flow system configured to provide a gas flow to help prevent contamination particles from passing through the aperture in the direction of the radiation, the suppression flow system comprising a flow distributing structure, in the aperture, comprising a plurality of gas flow inlets extending in a direction transverse to the direction of the radiation and to enhance flow homogeneity in the direction transverse to the direction of the radiation.

15. The radiation source system of claim 14, wherein a part of the wall is tapered in a direction toward a focal point of the radiation and the tapered part is within a radius of 0.15 m of the focal point.

16. The radiation source system of claim 14, wherein the flow distributing structure comprises a plurality of inlets extending along a tapered part of the aperture, the inlets arranged to supply gas to the aperture.

17. The radiation source system of claim 14, further comprising a pumping system configured to pump away gas and an outlet connected to the pumping system and the source chamber, the outlet located at or near the aperture and located outside the inner wall.

18. A method, comprising:
producing radiation in a source chamber having an inner wall with an aperture to pass the radiation out of the source chamber, the producing radiation comprising generating droplets of a fuel liquid and directing a laser beam to hit the generated droplets at an ignition location in the source chamber; and
providing a gas flow to help prevent contamination particles from passing through the aperture in the direction of the radiation using a flow distributing structure to enhance flow homogeneity in a direction transverse to the direction of the radiation, the flow distributing structure being in the aperture and comprising a plurality of gas flow inlets extending in the direction transverse to the direction of the radiation.

19. The method of claim 18, wherein the flow distributing structure comprises a plurality of inlets extending along a tapered part of the aperture, the inlets arranged to supply gas to the aperture.

20. The method of claim 18, further comprising pumping away gas through an outlet that is connected to the chamber, the outlet located at or near the aperture and located outside the inner wall.

* * * * *

UNITED STATES PATENT AND TRADEMARK OFFICE
CERTIFICATE OF CORRECTION

PATENT NO. : 8,749,756 B2  
APPLICATION NO. : 13/361545  
DATED : June 10, 2014  
INVENTOR(S) : Yuri Johannes Gabriël Van De Vijver et al.

It is certified that error appears in the above-identified patent and that said Letters Patent is hereby corrected as shown below:

On Title Page, Item (75) Inventors, Line 1
replace "Yuri Johannes Gabrial Van De Vijver"
with --Yuri Johannes Gabriël Van De Vijver--.

Signed and Sealed this
Sixteenth Day of September, 2014

Michelle K. Lee
*Deputy Director of the United States Patent and Trademark Office*